(12) United States Patent
Takenaga et al.

(10) Patent No.: US 8,036,024 B2
(45) Date of Patent: Oct. 11, 2011

(54) MAGNETIC STORAGE ELEMENT STORING DATA BY MAGNETORESISTIVE EFFECT

(75) Inventors: Takashi Takenaga, Tokyo (JP); Takeharu Kuroiwa, Tokyo (JP); Hiroshi Kobayashi, Tokyo (JP); Sadeh Beysen, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 910 days.

(21) Appl. No.: 11/442,290

(22) Filed: May 30, 2006

(65) Prior Publication Data
US 2006/0267058 A1 Nov. 30, 2006

(30) Foreign Application Priority Data
May 30, 2005 (JP) .................................. 2005-157459

(51) Int. Cl.
*G11B 5/39* (2006.01)
(52) U.S. Cl. .................. 365/158; 428/811.1; 428/811.5; 360/324.11; 360/324.12; 360/324.2
(58) Field of Classification Search .................. None
See application file for complete search history.

(56) References Cited

U.S. PATENT DOCUMENTS

| | | | |
|---|---|---|---|
| 6,271,997 B1* | 8/2001 | Gill | 360/314 |
| 6,531,723 B1 | 3/2003 | Engel et al. | |
| 6,936,903 B2* | 8/2005 | Anthony et al. | 257/422 |
| 6,950,333 B2* | 9/2005 | Hiramoto et al. | 365/158 |
| 7,130,166 B2* | 10/2006 | Gill | 360/324.12 |
| 7,163,755 B2* | 1/2007 | Hiramoto et al. | 428/811.3 |
| 7,242,556 B2* | 7/2007 | Gill | 360/324.12 |
| 7,280,326 B2* | 10/2007 | Gill | 360/324.12 |
| 7,423,850 B2* | 9/2008 | Gill et al. | 360/324.12 |
| 7,948,044 B2* | 5/2011 | Horng et al. | 257/421 |
| 2002/0034055 A1* | 3/2002 | Seyama et al. | 360/324.11 |
| 2003/0235016 A1* | 12/2003 | Gill | 360/324.12 |
| 2004/0218311 A1* | 11/2004 | Saito et al. | 360/314 |
| 2005/0276090 A1* | 12/2005 | Yamagishi | 365/145 |
| 2006/0034118 A1* | 2/2006 | Saito et al. | 365/158 |
| 2006/0108620 A1* | 5/2006 | Rizzo et al. | 257/295 |
| 2006/0126371 A1* | 6/2006 | Nagase et al. | 365/145 |

(Continued)

FOREIGN PATENT DOCUMENTS
JP 2005-510048 T 4/2005

OTHER PUBLICATIONS

Japanese Notice of Grounds of Rejection, w/ English translation thereof, issued in Japanese Patent Application No. JP 2005-157459 dated Jan. 25, 2011.

(Continued)

Primary Examiner — Kevin Bernatz
(74) Attorney, Agent, or Firm — McDermott Will & Emery LLP

(57) ABSTRACT

In a ferromagnetic tunnel junction element, a recording layer is in a circular shape, which can suppress an increase in magnetization switching field due to miniaturization of the element. Further, the recording layer includes a first ferromagnetic layer, a first non-magnetic layer, a second ferromagnetic layer, a second non-magnetic layer, and a third ferromagnetic layer successively stacked. The first and second ferromagnetic layers, and the second and third ferromagnetic layers are coupled antiparallel to each other, so that it is possible to control the magnetization distribution of the recording layer in an approximately single direction.

3 Claims, 8 Drawing Sheets

U.S. PATENT DOCUMENTS

| | | | |
|---|---|---|---|
| 2007/0019463 A1* | 1/2007 | Saito et al. | 365/158 |
| 2007/0097731 A1* | 5/2007 | Abraham et al. | 365/158 |
| 2007/0119463 A1* | 5/2007 | Nelson et al. | 128/848 |
| 2007/0297102 A1* | 12/2007 | Gill | 360/324.11 |
| 2010/0173173 A1* | 7/2010 | Katou | 428/800 |

OTHER PUBLICATIONS

S. Tehrani et al., "High density submicron magnetoresistive random access memory (invited)", Journal of Applied Physics, vol. 85, No. 8, Apr. 15, 1999, pp. 5822-5827.

Naji et al., "A 256kb 3.0V IT1MTJ Nonvolatile Magnetoresistive Ram", ISSCC 2001 Digest of Technical Papers, pp. 122-123.

E.Y. Chen et al., "Submicron spin valve magnetoresistive random access memory cell", Journal of Applied Physics, vol. 81, No. 8, Apr. 15, 1997, pp. 3992-3994.

K. Inomata et al., "Size-independent spin switching field using synthetic antiferromagnets", Applied Physics Letters, vol. 82, No. 16, Apr. 21, 2003, pp. 2667-2669.

N. Tezuka et al., "Magnetization reversal and domain structure of antiferromagnetically coupled submicron elements", Journal of Applied Physics, vol. 93, No. 10, May 15, 2003, pp. 7441-7443.

* cited by examiner

FIG.3A "0"
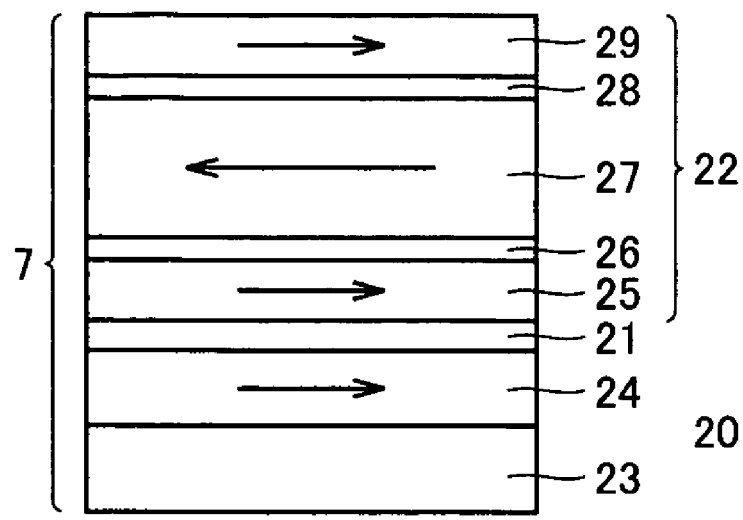
FIG.3B "1"
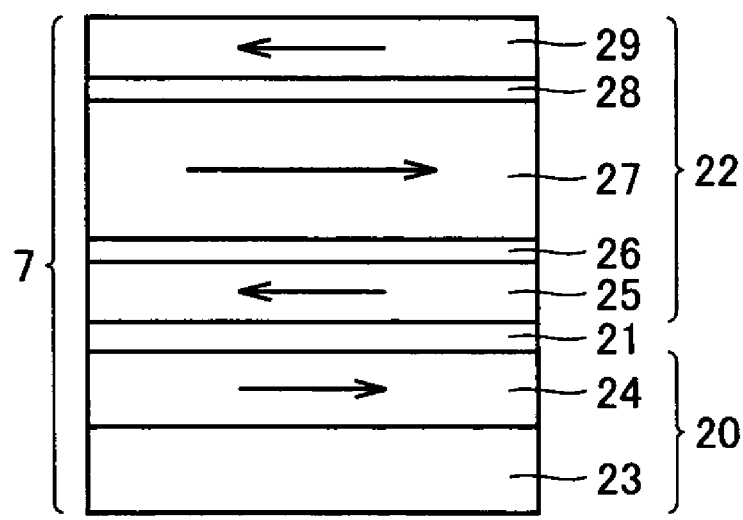

FIG.8A "0"
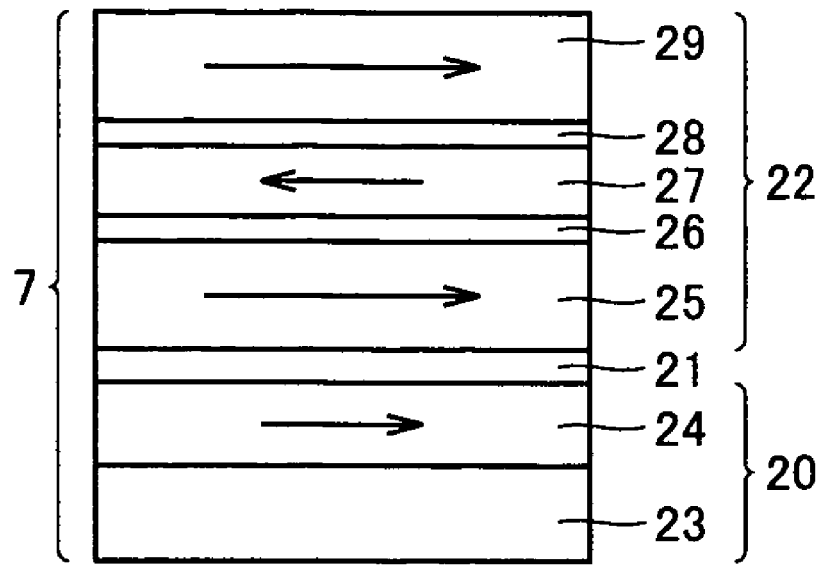
FIG.8B "1"
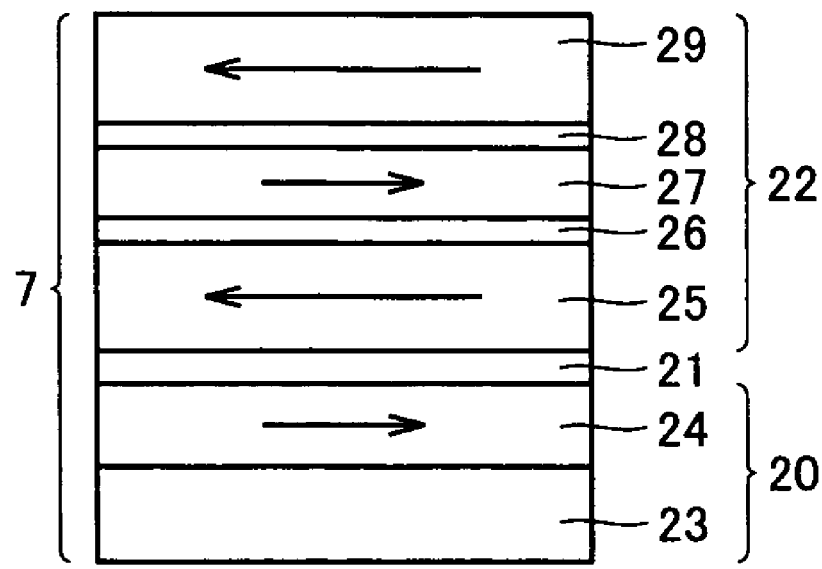

MAGNETIC STORAGE ELEMENT STORING DATA BY MAGNETORESISTIVE EFFECT

BACKGROUND OF THE INVENTION

1. Field of the Invention

The present invention relates to a magnetic storage element, and more particularly to a magnetic storage element that stores data by a magnetoresistive effect.

2. Description of the Background Art

The magnetoresistive (MR) effect is a phenomenon in which electric resistance is changed by applying a magnetic field to a magnetic material, which effect is used for a magnetic field sensor, a magnetic head and the like. Recently, a nonvolatile magnetic random access memory (RAM) and a magnetic head using a conventional giant-magnetoresistance (GMR) effect as well as a tunneling magnetoresistance (TMR) effect that assures a still larger rate of change of resistance than the GMR effect have been investigated.

In the GMR element or the TMR element producing the GMR effect or the TMR effect, a so-called spin valve structure is known, in which a ferromagnetic layer/a non-magnetic layer/a ferromagnetic layer/an antiferromagnetic layer are stacked one on another, with the ferromagnetic layer and the antiferromagnetic layer being exchange-coupled to fix the magnetic moment of the relevant ferromagnetic layer, and spin is readily reversed only in the other ferromagnetic layer by an external magnetic field. In this case, spin can be reversed in one of the ferromagnetic layers with a small magnetic field, so that it is possible to provide a magnetoresistance element of high sensitivity. This magnetoresistance element is used for a high-density magnetic recording and readout head. In the GMR element, a metal film is used for the non-magnetic layer, while in the TMR element, a tunneling insulating film is used for the non-magnetic layer.

Investigations of application of the GMR element and the TMR element to the MRAM are shown, e.g., in Document 1 (S. Tehrani et al., "High density submicron magnetoresistive random access memory (invited)", Journal of Applied Physics, vol. 85, No. 8, 15 Apr. 1999, pp. 5822-5827) and Document 2 (Naji et al., "A 256 kb 3.0V 1T1MTJ Nonvolatile Magnetoresistive RAM", ISSCC 2001 Digest of Technical Papers, p. 122). When using the GMR element and the TMR element in the MRAM, these elements are arranged in a matrix, and a current is flown through a separately provided interconnection to apply the magnetic field. The two magnetic layers constituting each element are controlled parallel or antiparallel to each other, to thereby record data of "1" or "0". Reading is performed utilizing the GMR effect or the TMR effect, utilizing the change in the element resistance value that depends on the parallel state or the antiparallel state of the magnetic layers.

The use of TMR elements in MRAM has primarily been investigated, since the TMR effect is more advantageous than the GMR effect from the standpoint of low power consumption. The MRAM utilizing the TMR elements has the MR change rate of not less than 20% at room temperature, and the resistance value in the tunnel junction is also large, so that a greater output voltage can be obtained. Further, spin reversal is unnecessary upon reading, meaning that a less current is required for the reading. With these features, the MRAM utilizing the TMR elements is expected to realize a nonvolatile semiconductor memory device consuming less power and allowing high-speed reading and writing.

As described above, in MRAM, data "1" or "0" is stored by switching the magnetization of one ferromagnetic layer in the TMR element. This ferromagnetic layer serving as the recording layer has a direction in which magnetization is easy (the low energy state) depending on the crystal structure or the shape. This direction is called an "easy axis". In the state where the stored information is held, the ferromagnetic layer is magnetized in this direction. In contrast, the direction in which magnetization is difficult is called a "hard axis".

The easy axis of the recording layer is normally determined by its shape, and corresponds to the longitudinal direction of the recording layer. As such, the magnetic field required for switching the magnetization of the recording layer, i.e., the switching field, changes depending on the shape of the recording layer. It is known that this switching field is approximately inversely proportional to the width of the recording layer and proportional to the thickness, as shown in Document 3 (E. Y. Chen et al., "Submicron spin valve magnetoresistive random access memory cell", Journal of Applied Physics, vol. 81, No. 8, 15 Apr. 1997, pp. 3992-3994).

In MRAM, when cells are downsized for higher integration, the switching field would increase by the demagnetizing field, depending on the width of the recording layer. This means that a large magnetic field is required for writing, which leads to increased power consumption.

As a method for suppressing an increase of the switching field due to the downsizing as described above, a technique to eliminate the shape anisotropy of the recording layer is described in Document 4 (K. Inomata et al., "Size-independent spin switching field using synthetic antiferromagnets", Applied Physics Letters, vol. 82, No. 16, 21 Apr. 2003, pp. 2667-2669) and Document 5 (N. Tezuka et al., "Magnetization reversal and domain structure of antiferromagnetically coupled submicron elements", Journal of Applied Physics, vol. 93, No. 10, 15 May 2003, pp. 7441-7443). The recording layer according to this technique is shaped to have equal lengths in the easy axis direction and the hard axis direction. In this case, shape anisotropy is not obtained, and thus, the recording layer is made to have a stacked structure of ferromagnetic/non-ferromagnetic/ferromagnetic layers, and two ferromagnetic layers are coupled antiparallel to each other so as to control the magnetization distribution within the plane of the recording layer and to thereby provide magnetic anisotropy. The switching field of the recording layer with this configuration is approximated by the following expression (1):

$$Hsw = 2Ku(t2+t1)/|M2t2 - M1t1| + 4\pi C(k)|M2t2 - M1t1|/w \quad (1)$$

where Hsw represents the switching field of the recording layer, Ku represents anisotropic energy of the recording layer, t1 and t2 represent thicknesses of the respective ferromagnetic layers, and M1 and M2 represent saturation magnetizations of the respective ferromagnetic layers. Further, k represents an aspect ratio of the recording layer, and C(k) is a coefficient dependent thereon, and t and w represent thickness and width, respectively, of the recording layer.

C(k) can be regarded as "1" for the shape having an infinite length, and "0" for the isotropic shape. The first term in the right side of the expression (1) is a term by anisotropic energy, and the second term is a term describing the influence of the demagnetizing field generated by shape anisotropy. Herein, C(k)=0, and the influence of the demagnetizing field generated by the shape anisotropy can be ignored. As such, it is possible to suppress the increase in switching field due to the miniaturization of the recording layer.

In the above-described configuration, providing a difference between the products of saturation magnetization and thickness of the two ferromagnetic layers can decrease the magnetization switching field, as seen from the expression (1). However, it is reported in Document 5 that, if the difference in thickness between the two ferromagnetic layers increases, the effect of antiparallel coupling decreases, making it difficult to control the magnetization distribution in the recording layer.

In the recording layer having such a stacked structure, it is difficult to suppress the increase in switching field due to the miniaturization of the element and to control the magnetization distribution in the recording layer.

SUMMARY OF THE INVENTION

In view of the foregoing, a main object of the present invention is to provide a magnetic storage element capable of suppressing an increase in magnetization switching field due to miniaturization of the element and capable of controlling magnetization distribution in a recording layer.

A magnetic storage element according to the present invention includes a recording layer arranged between two writing lines crossing each other and having a magnetization direction changed in accordance with directions of currents flown on the two writing lines. The recording layer has a length in a hard axis direction approximately equal to a length in an easy axis direction. The recording layer includes a first ferromagnetic layer, a first non-magnetic layer, a second ferromagnetic layer, a second non-magnetic layer, and a third ferromagnetic layer stacked successively, and the first ferromagnetic layer and the second ferromagnetic layer, and the second ferromagnetic layer and the third ferromagnetic layer are coupled antiparallel to each other.

In the magnetic storage element of the present invention, the recording layer has the length in the hard axis direction that is made approximately equal to the length in the easy axis direction. This can suppress an increase in magnetization switching field due to miniaturization of the element. Further, the recording layer is formed of the first ferromagnetic layer, the first non-magnetic layer, the second ferromagnetic layer, the second non-magnetic layer, and the third ferromagnetic layer, which are successively stacked. The first and second ferromagnetic layers are coupled antiparallel to each other, and the second and third ferromagnetic layers are also coupled antiparallel to each other. This enables control of the magnetization distribution within the plane of the recording layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B are cross sectional views each showing a configuration and a storage state of the ferromagnetic tunnel junction element shown in FIG. 1.

FIGS. 8A and 8B are cross sectional views showing another modification of the present embodiment.

DESCRIPTION OF THE PREFERRED EMBODIMENTS

Figure 1:
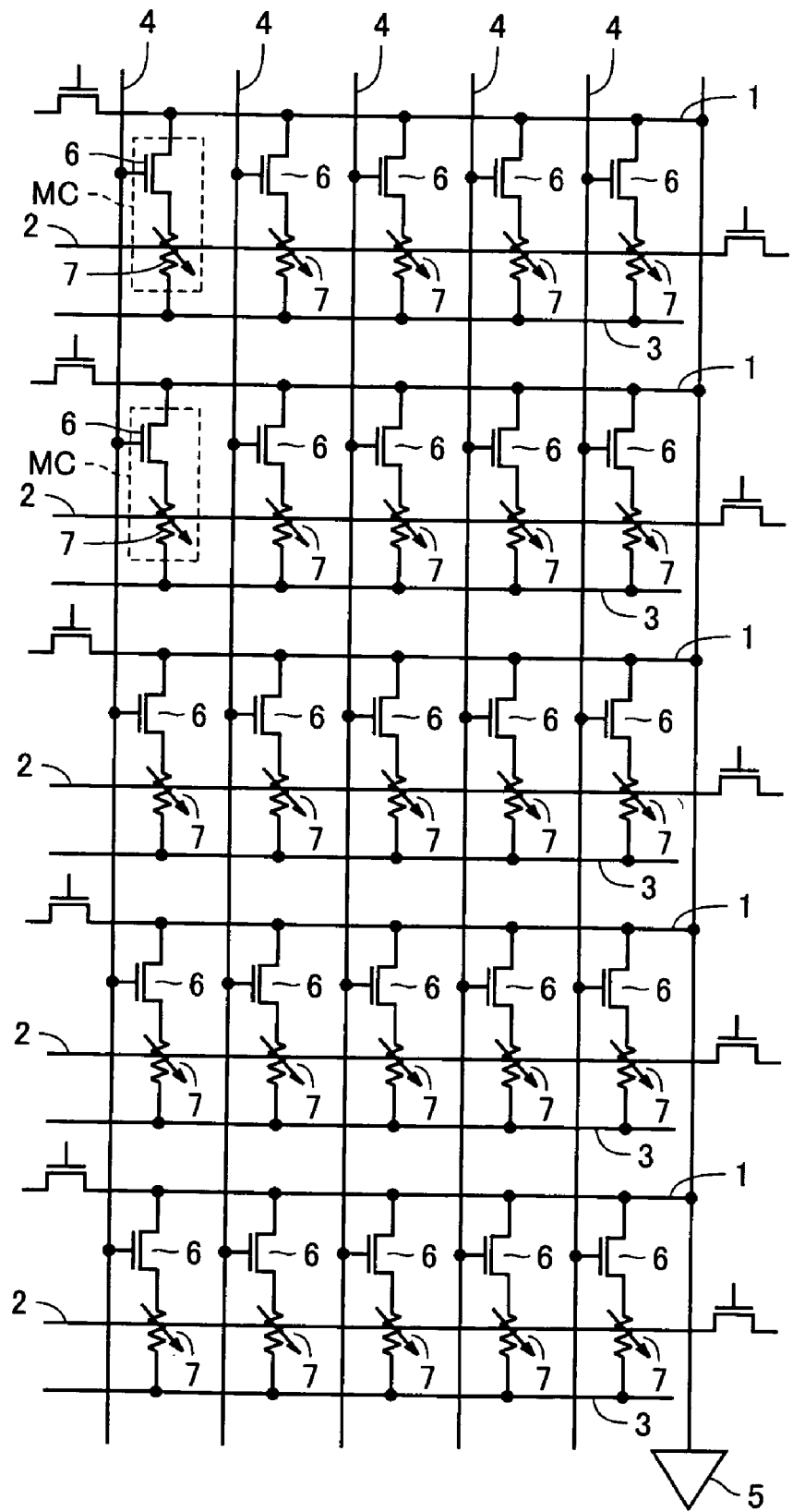
FIG. 1 is a circuit diagram showing a main part of an MRAM that uses a ferromagnetic tunnel junction element according to an embodiment of the present invention.

FIG. 1 is a circuit diagram showing a main part of an MRAM using a ferromagnetic tunnel junction element according to an embodiment of the present invention. In FIG. 1, a reading bit line 1, a write line 2 and a writing bit line 3 extend in a horizontal direction in the figure, with a plurality of sets of lines 1-3 arranged in a vertical direction in the figure. A word line 4 extends in the vertical direction in the figure to cross the plurality of sets of lines 1-3, with a plurality of such word lines 4 arranged in the horizontal direction in the figure. A plurality of reading bit lines 1 are commonly connected to an input node of a sense amplifier 5.

A memory cell MC is provided at each crossing point of the set of lines 1-3 and word line 4, with a plurality of such memory cells MC arranged in a matrix. Each memory cell MC includes a transistor for selecting an element (hereinafter, "element selecting transistor") 6 and a ferromagnetic tunnel junction element 7 serving as a magnetic storage element, connected in series. More specifically, ferromagnetic tunnel junction element 7 is arranged at the crossing point of write line 2 and writing bit line 3.

Figure 2:
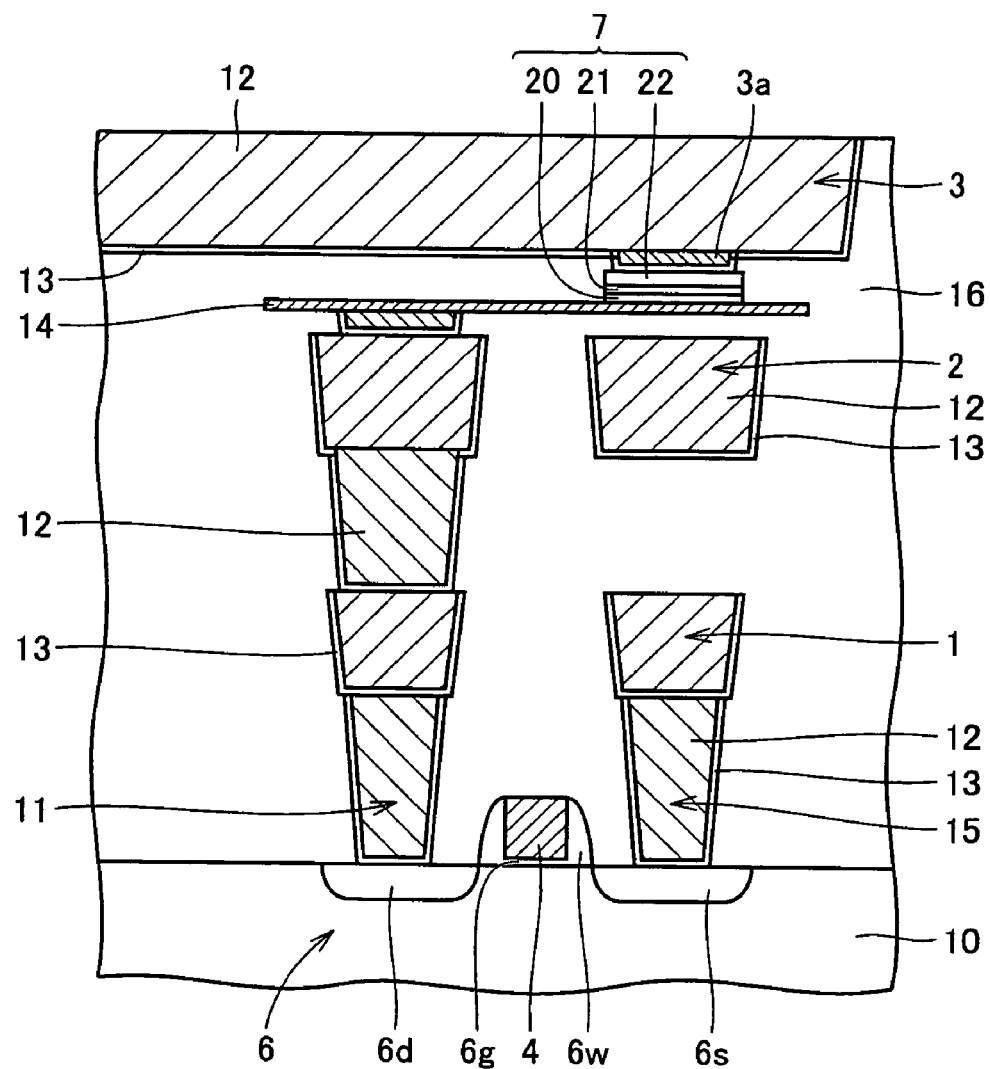
FIG. 2 is a cross sectional view showing a configuration of a memory cell shown in FIG. 1.

FIG. 2 is a schematic cross sectional view showing a configuration of memory cell MC. Element selecting transistor 6 is formed at an upper surface of a semiconductor substrate 10. Word line 4 serves as a gate electrode of transistor 6, with a gate insulating film 6g provided between word line 4 and semiconductor substrate 10. A sidewall 6w is provided on each side of word line 4. Element selecting transistor 6 has its drain 6d connected to ferromagnetic tunnel junction element 7 via a contact plug 11 and a conductive layer 14, and has its source 6s connected to reading bit line 1 via a contact plug 15. Write line 2 is provided between conductive layer 14 and semiconductor substrate 10, insulated via an interlayer insulating film 16. Contact plugs 11 and 15 are each stacked in a plurality of stages in interlayer insulating film 16, for example. The respective stages of contact plugs 11 and 15, reading bit line 1, write line 2, and writing bit line 3 each include, e.g., a copper interconnection 12 and a barrier metal 13 surrounding copper interconnection 12.

Ferromagnetic tunnel junction element 7 has a fixed layer 20, a tunneling insulating layer 21, and a recording layer 22 stacked in this order from the side of semiconductor substrate 10. Fixed layer 20 is conductive with contact plug 11, and recording layer 22 is conductive with writing bit line 3. Writing bit line 3 has an opening portion 3a for contact with recording layer 22.

FIGS. 3A and 3B are cross sectional views each showing a configuration and a storage state of ferromagnetic tunnel junction element 7. In FIGS. 3A and 3B, magnetization of fixed layer 20 is fixed in advance in a prescribed direction, for example in the extending direction of write line 2. Recording layer 22 has its magnetization direction changed by an external magnetic field. It is assumed that the state where the magnetization direction of fixed layer 20 is the same as the magnetization direction of a ferromagnetic layer 25 constituting recording layer 22 and in contact with tunneling insulating layer 21, as shown in FIG. 3A, corresponds to the state where ferromagnetic tunnel junction element 7 stores data "0", and the state where the magnetization direction of fixed layer 20 is opposite to the magnetization direction of ferromagnetic layer 25 of recording layer 22, as shown in FIG. 3B, corresponds to the state where ferromagnetic tunnel junction element 7 stores data "1".

Fixed layer 20 has its magnetization direction fixed by a stacked structure of an antiferromagnetic layer 23 and a ferromagnetic layer 24, for example. Specifically, antiferromagnetic layer 23 fixes the spin direction of ferromagnetic layer 24 to thereby fix the magnetization direction of ferromagnetic layer 24. Antiferromagnetic layer 23 is provided beneath ferromagnetic layer 24 (i.e., on the side opposite to recording layer 22). For example, CoFe may be used for ferromagnetic layer 24, and PtMn may be used for antiferromagnetic layer 23.

Recording layer 22 is formed of a ferromagnetic layer 25, a non-magnetic layer 26, a ferromagnetic layer 27, a non-magnetic layer 28, and a ferromagnetic layer 29 stacked in this order from the side of tunneling insulating layer 21. For ferromagnetic layers 25, 27 and 29, a CoFe layer, for example, may be used. For non-magnetic layers 26 and 28, a Ru film may be used, for example. The respective ferromagnetic layers are coupled antiparallel to each other via the Ru film. Specifically, ferromagnetic layers 25 and 27, and ferromagnetic layers 27 and 29 are antiparallel coupled to each other. Here, when the thicknesses of ferromagnetic layers 25, 27 and 29 are represented as t1, t2 and t3, respectively, $t2>t1+t3$, and when saturation magnetization of the respective CoFe films is represented as M, the magnetization of the entire recording layer 22 is $M \cdot \{t2-(t1+t3)\}$, which magnetization is switched by receiving torque of the external magnetic field.

A process of providing magnetic anisotropy for determination of an easy axis of recording layer 22 is carried out at the time of formation of ferromagnetic layers 25, 27 and 29, and also carried out upon heat treatment in a post-process. For example, upon formation of ferromagnetic layers 25, 27 and 29, a uniform magnetic field of 100 Oe is applied in the film surface direction. Patterning is performed such that this direction corresponds to the easy axis. After formation of ferromagnetic tunnel junction element 7 as well, the magnetic field is applied in the similar direction to carry out heat treatment. At this time, to simultaneously determine the magnetization direction of fixed layer 20, the magnetic field that can saturate magnetization of ferromagnetic layer 24 of fixed layer 20 as well as recording layer 22 is applied. For example, 5 kOe is applied and held at 300° C. for one hour.

Figure 4:
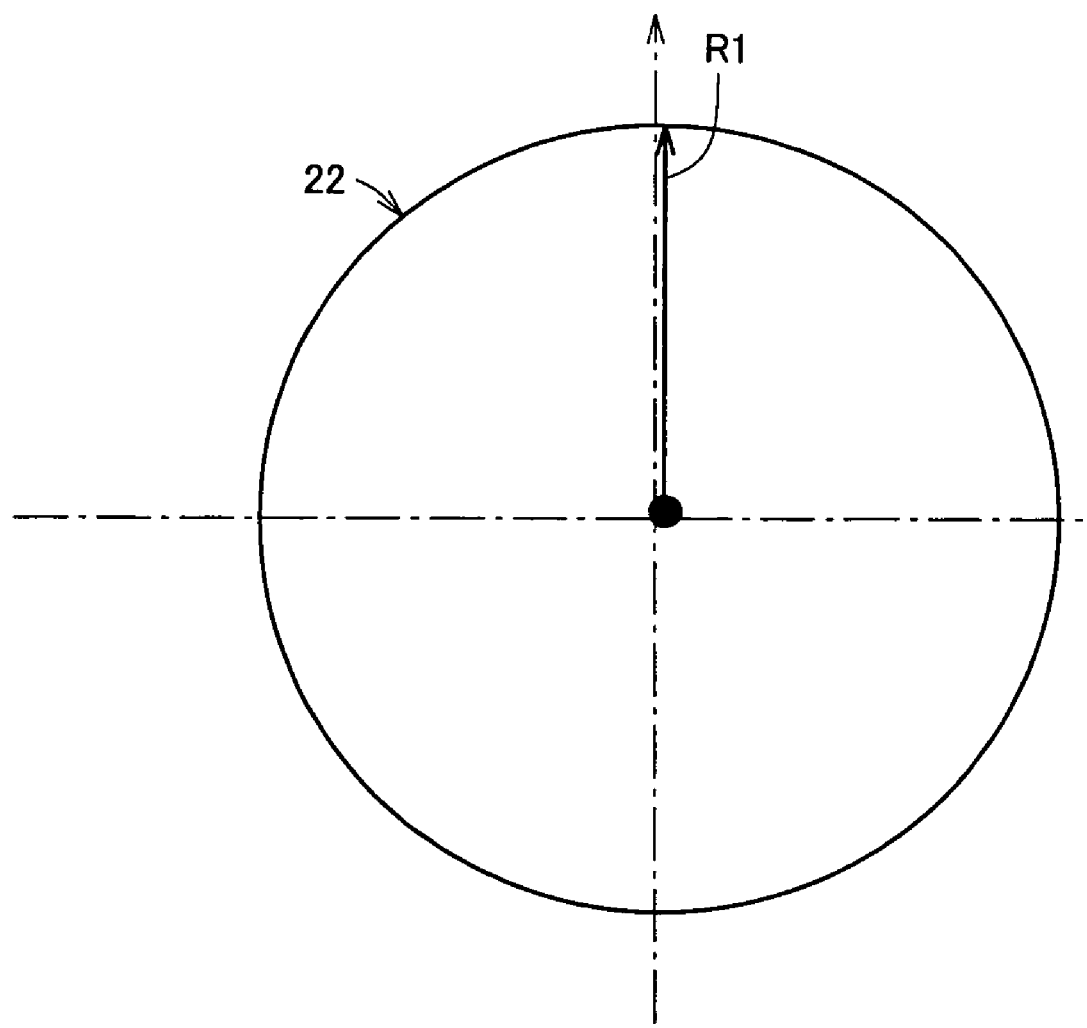
FIG. 4 is a top plan view showing the shape of the recording layer shown in FIGS. 3A and 3B.

As shown in FIG. 4, recording layer 22 is in a circle shape in two dimensions. The radius R1 of recording layer 22 is 50 nm, for example. AlOx, for example, may be used for tunneling insulating layer 21. Tunneling insulating layer 21 and fixed layer 20 may each have the same shape as recording layer 22, or they may each have a larger area than recording layer 22 covering the shape of recording layer 22.

Figure 5:
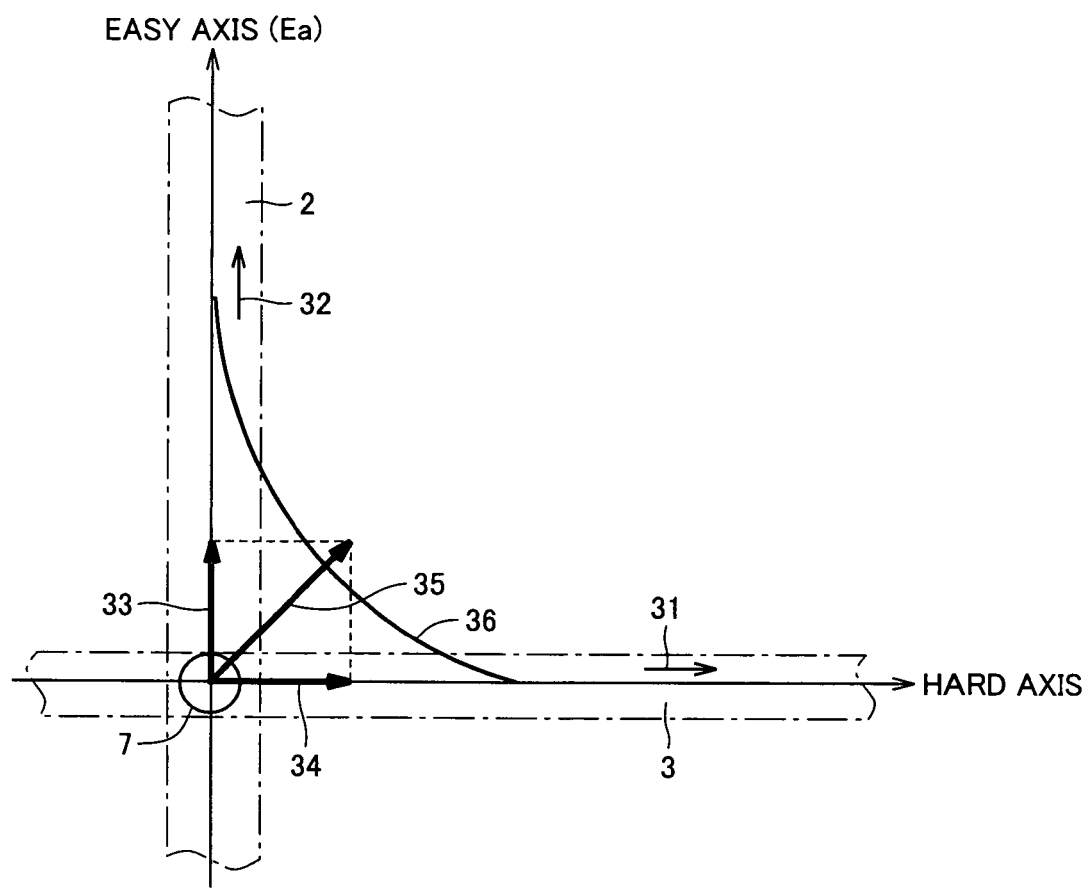
FIG. 5 is a top plan view showing the vicinity of the ferromagnetic tunnel junction element shown in FIG. 1.

A writing operation to ferromagnetic tunnel junction element 7 will now be described. FIG. 5 is a top plan view showing the vicinity of ferromagnetic tunnel junction element 7. Writing bit line 3 and write line 2 extend in directions orthogonal to each other. Ferromagnetic tunnel junction element 7 is arranged at the crossing point of write line 2 and writing bit line 3 as seen in two dimensions. It is noted that ferromagnetic tunnel junction element 7 is arranged above write line 2 (opposite from the side of semiconductor substrate 10) and arranged below writing bit line 3 (on the side of semiconductor substrate 10), as shown in FIG. 2.

A ferromagnetic material generally has a direction in which it is easily magnetized (low state of energy) depending on the crystal structure, shape or the like. This direction is called the "easy axis". By comparison, the direction in which magnetization is difficult is called the "hard axis". The easy axis and the hard axis of recording layer 22 are set to the extending directions of write line 2 and writing bit line 3, respectively.

At the time of writing, a current is flown on each of writing bit line 3 and write line 2. On writing bit line 3, the current is flown in the direction shown by an arrow 31, for example, which causes a magnetic field to be generated in the direction surrounding writing bit line 3. With this magnetic field, a magnetic field 33 in the easy axis direction is applied to recording layer 22 that is arranged beneath writing bit line 3. On the other hand, on write line 2, the current is flown in the direction shown by an arrow 32, for example, so that a magnetic field is generated in the direction surrounding write line 2. With this magnetic field, a magnetic field 34 in the hard axis direction is applied to recording layer 22 that is positioned above write line 2. As such, at the time of writing, a composite magnetic field 35 of magnetic fields 33 and 34 is applied to recording layer 22.

Meanwhile, the magnitude of the magnetic field required for switching the direction of magnetization of recording layer 22 becomes an asteroid curve shown by a curve 36. In the direction of magnetic field 35, when magnetic field 35 takes a value greater than that of curve 36, recording layer 22 is magnetized in the direction shown by arrow 32 corresponding to the easy axis direction.

In the case where fixed layer 20 is magnetized in advance in the same direction as magnetic field 33, in ferromagnetic tunnel junction element 7, the magnetization direction of fixed layer 20 and that of ferromagnetic layer 25 of recording layer 22 are parallel to each other (state of FIG. 3A: "0" is stored). In this case, the resistance value in the thickness direction of ferromagnetic tunnel junction element 7 (in the direction in which recording layer 22 and fixed layer 20 are stacked) is small.

When fixed layer 20 is magnetized in advance in the opposite direction from magnetic field 33, in ferromagnetic tunnel junction element 7, the magnetization direction of fixed layer 20 and that of ferromagnetic layer 25 of recording layer 22 are antiparallel to each other (state of FIG. 3B: "1" is stored). In this case, the resistance value in the thickness direction of ferromagnetic tunnel junction element 7 is large. This state also occurs in the case where fixed layer 20 is magnetized in advance in the same direction as magnetic field 33 in the figure and a current is flown on writing bit line 3 in the direction opposite to the direction shown by arrow 31.

A reading operation will now be described. At the time of reading, a prescribed word line 4 is selected and driven to cause element selecting transistor 6 connected to the relevant word line 4 to attain an on state. Further, a current is flown through a prescribed writing bit line 3 to cause a tunneling current to be flown on ferromagnetic tunnel junction element 7 connected to element selecting transistor 6 of the on state. Stored data is determined based on the resistance value of ferromagnetic tunnel junction element 7 at this time. More specifically, ferromagnetic tunnel junction element 7 has a small resistance value when the magnetization direction is parallel, while it has a large resistance value when the magnetization direction is antiparallel. Sense amplifier 5 utilizes such properties to determine whether the output signal of selected memory cell MC is greater or smaller with respect to the output signal of a reference cell (not shown). In this manner, it is determined whether the stored data in selected memory cell MC is "0" or "1".

Figure 6A:
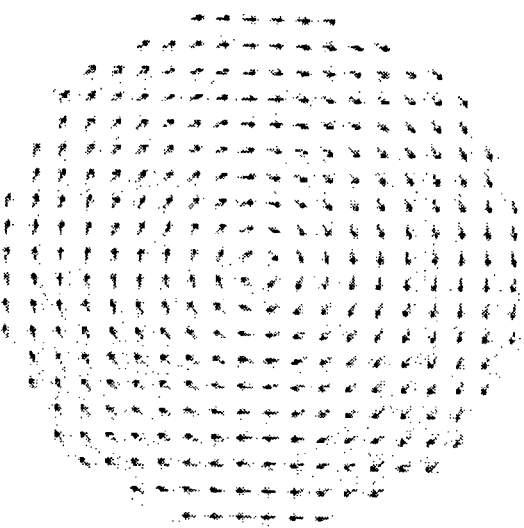
FIGS. 6A, 6B and 6C illustrate the effect of the present embodiment.
Figure 6B:
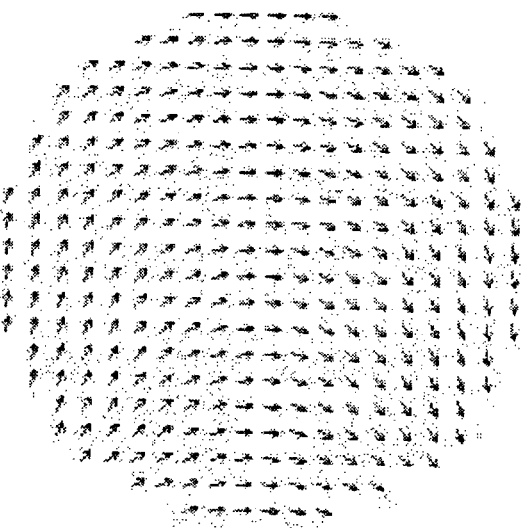
Figure 6C:
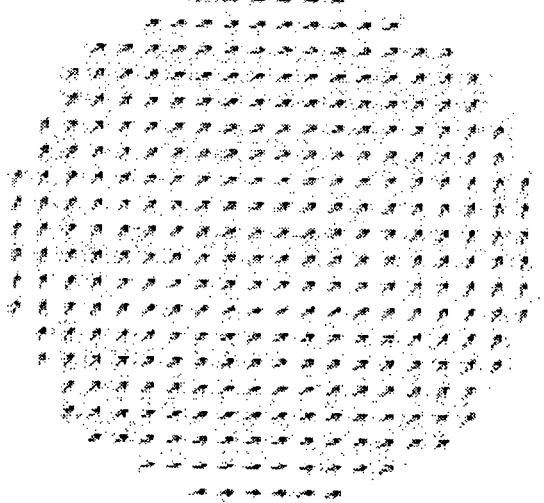

As shown in FIG. 4, recording layer 22 does not have shape anisotropy, and thus, there is no increase in magnetization switching field even if recording layer 22 is miniaturized. When the present configuration is used, the thickest ferromagnetic layer 27 is coupled in the vertical direction in the antiparallel manner, and thus, the magnetization distribution becomes uniform within the plane of recording layer 22, so that stable magnetic characteristics can be obtained. FIG. 6C shows the magnetization distribution in recording layer 22 obtained with the present configuration, which is compared with the magnetization distribution of the conventional structure shown in FIGS. 6A and 6B. Here, the magnetization distribution in ferromagnetic layer 25 in contact with tunneling insulating film 21 is shown. In the state of FIGS. 6A and 6B, the magnetization is closed within the plane of the film, which is unlikely to receive torque from the external magnetic field, leading to an increased switching field. In the state of FIG. 6A, magnetization of the entire recording layer is 0, so that it is not possible to obtain a magnetoresistance change rate. In the first embodiment, the magnetization distribution shown in FIG. 6C is obtained, and there is no increase in magnetization switching field due to the above-described reasons.

Although ferromagnetic layers 25, 27 and 29 are formed of a CoFe film in the present embodiment, all that is needed is that ferromagnetic layers 25, 27 and 29 are made of a film having a Co or Fe element as its main component, like CoFeB. Further, non-magnetic layers 26 and 28 are not restricted to the Ru film, but may be Cu, Ta or other metal film.

Figure 7:
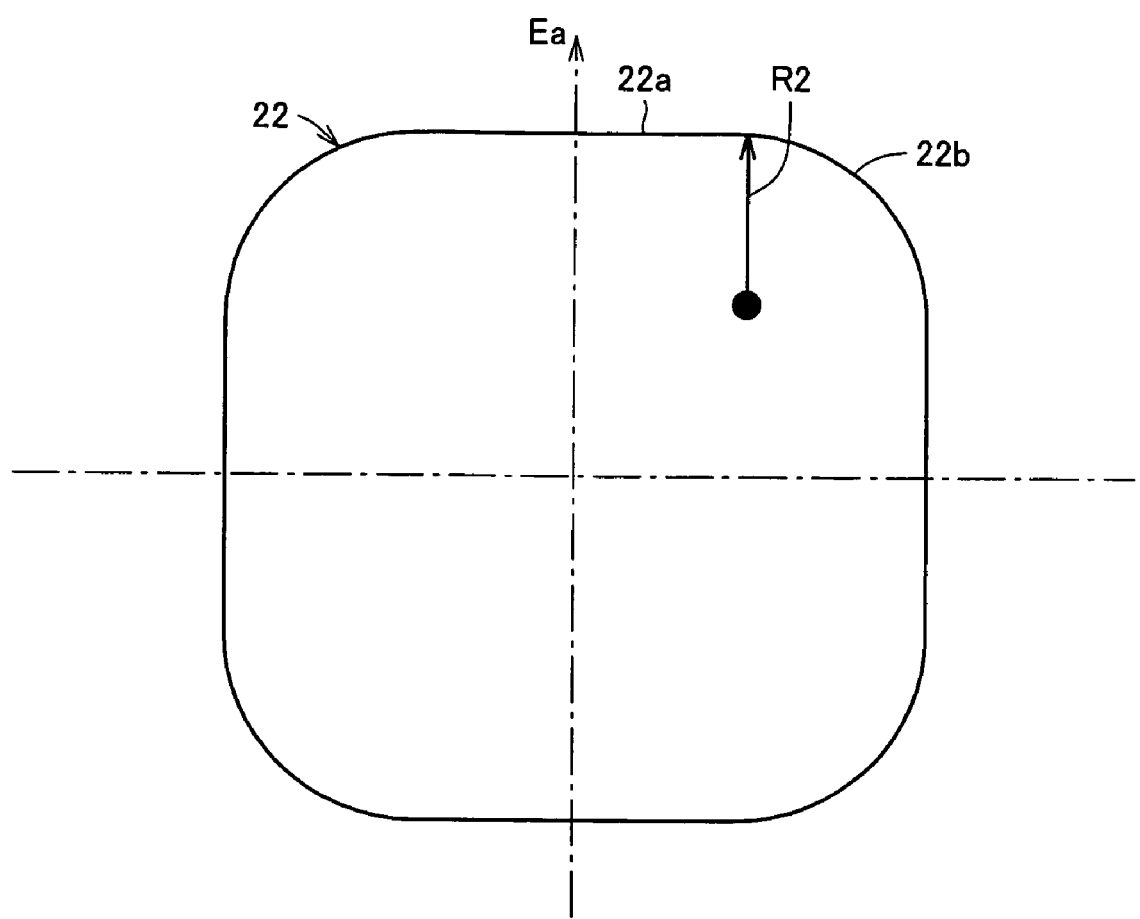
FIG. 7 is a top plan view showing a modification of the present embodiment.

Furthermore, recording layer 22 does not necessarily have to be of a circular shape. It may have a square shape with truncated corners, as shown in FIG. 7. In FIG. 7, the contour of recording layer 22 is formed with four straight-line parts 22a and four arcs 22b that constitute a closed curve. Here, straight-line part 22a may have a length of 50 nm, for example, and arc 22b may have a radius R2 of 50 nm, for example. The stacked structure of recording layer 22 is as shown in FIGS. 3A and 3B.

FIGS. 8A and 8B show cross sectional views of a modification of the present embodiment, which figures are in contrast with FIGS. 3A and 3B. In FIGS. 8A and 8B, in ferromagnetic tunnel junction element 7, thicknesses t1, t2 and t3 of respective ferromagnetic layers 25, 27 and 29 satisfy t1+t3>t2. When the saturation magnetization of each of the CoFe films is represented as M, magnetization of the entire recording layer 22 is $M \cdot \{(t1+t3)-t2\}$. This magnetization is switched by receiving the torque from the external magnetic field. The other configurations and effects are similar to those of the above-described embodiment, and thus, description thereof will not be repeated.

In the present embodiment, the magnetic field generated by the interconnection current is used as means for switching the magnetization. Alternatively, spin-polarized electrons may be introduced into recording layer 22 over tunneling insulating film 21 to switch the magnetization by the torque, in which case similar effects can be obtained as well.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetic memory device, comprising a tunneling magnetoresistance element arranged between two writing lines crossing each other and having a magnetization direction changed by applying a magnetic field in accordance with directions of currents flown on said two writing lines, wherein said tunneling magnetoresistance element includes a fixed layer, a tunneling insulating layer and a recording layer stacked in this order, said recording layer has a length in a hard axis direction approximately equal to a length in an easy axis direction, said recording layer includes a first ferromagnetic layer, a first non-magnetic layer, a second ferromagnetic layer, a second non-magnetic layer, and a third ferromagnetic layer stacked successively in this order, said first ferromagnetic layer and said second ferromagnetic layer, and said second ferromagnetic layer and said third ferromagnetic layer are coupled antiparallel to each other, said first, second, and third ferromagnetic layers include a same ferromagnetic material and a same saturation magnetization, said ferromagnetic material is CoFe or CoFeB, a thickness of said second ferromagnetic layer is larger than a sum of thicknesses of said first and third ferromagnetic layers, said tunneling insulating layer and said fixed layer each has a larger area than said recording layer, and said recording layer has a square shape with truncated corners and a contour of said recording layer is formed with four straight-line parts and four arcs that constitute a closed curve.

2. The magnetic memory device according to claim 1, wherein magnetic anisotropy is provided to said recording layer by applying a magnetic field at the time of formation of said recording layer and at the time of heat treatment.

3. The magnetic memory device according to claim 1, wherein said straight-line part has a length of 50 nm, and said arc has a radius of 50 nm.

* * * * *